United States Patent
Hou et al.

(10) Patent No.: US 6,885,215 B1
(45) Date of Patent: Apr. 26, 2005

(54) VOLTAGE DETECTOR CIRCUIT WITH A PROGRAMMABLE THRESHOLD POINT

(75) Inventors: Hungyu H. Hou, Sunnyvale, CA (US); Hassan M. Hanjani, Fremont, CA (US); A. Karl Rapp, Los Gatos, CA (US)

(73) Assignee: Fairchild Semiconductor Corporation, South Portland, ME (US)

( * ) Notice: Subject to any disclaimer, the term of this patent is extended or adjusted under 35 U.S.C. 154(b) by 0 days.

(21) Appl. No.: 10/827,013

(22) Filed: Apr. 19, 2004

Related U.S. Application Data

(63) Continuation of application No. 09/780,208, filed on Feb. 9, 2001, now abandoned.

(51) Int. Cl.[7] .......................... G01R 31/36; G01R 31/02
(52) U.S. Cl. ........................................ 324/771; 324/763
(58) Field of Search ................................ 324/771, 119, 324/535, 74, 765, 763, 103 P; 386/50; 340/660, 661, 662, 663; 327/530, 576, 538, 1–99, 404, 534, 540–541; 326/31, 33

(56) References Cited

U.S. PATENT DOCUMENTS

| | | | |
|---|---|---|---|
| 5,132,565 A | * | 7/1992 | Kuzumoto .................. 326/34 |
| 5,444,663 A | * | 8/1995 | Furuno et al. ............... 365/226 |
| 5,497,117 A | * | 3/1996 | Nakajima et al. ............ 327/404 |
| 6,157,222 A | * | 12/2000 | Yaklin .......................... 327/81 |

OTHER PUBLICATIONS

ASSP Power Supply Monitor MB3771, Fujitsu Ltd. 1994 (DS04–27400–SE), 20 pages.*

* cited by examiner

*Primary Examiner*—Evan Pert
*Assistant Examiner*—Paresh Patel
(74) *Attorney, Agent, or Firm*—Sidley Austin Brown & Wood LLP

(57) ABSTRACT

A voltage detector including a voltage following circuit connected to a power supply and operable to follow a voltage value of the power supply, a selectable threshold point circuit connected to the voltage following circuit and operable to select one of a plurality of values for a threshold point of the power supply, and a switch circuit coupled to the selectable threshold point circuit and the voltage following circuit, the switch circuit cooperating with the selectable threshold point circuit to generate an output indicating whether the value of the power supply has increased above or decreased below the selected value for the threshold point in response to the followed value of the power supply.

35 Claims, 3 Drawing Sheets

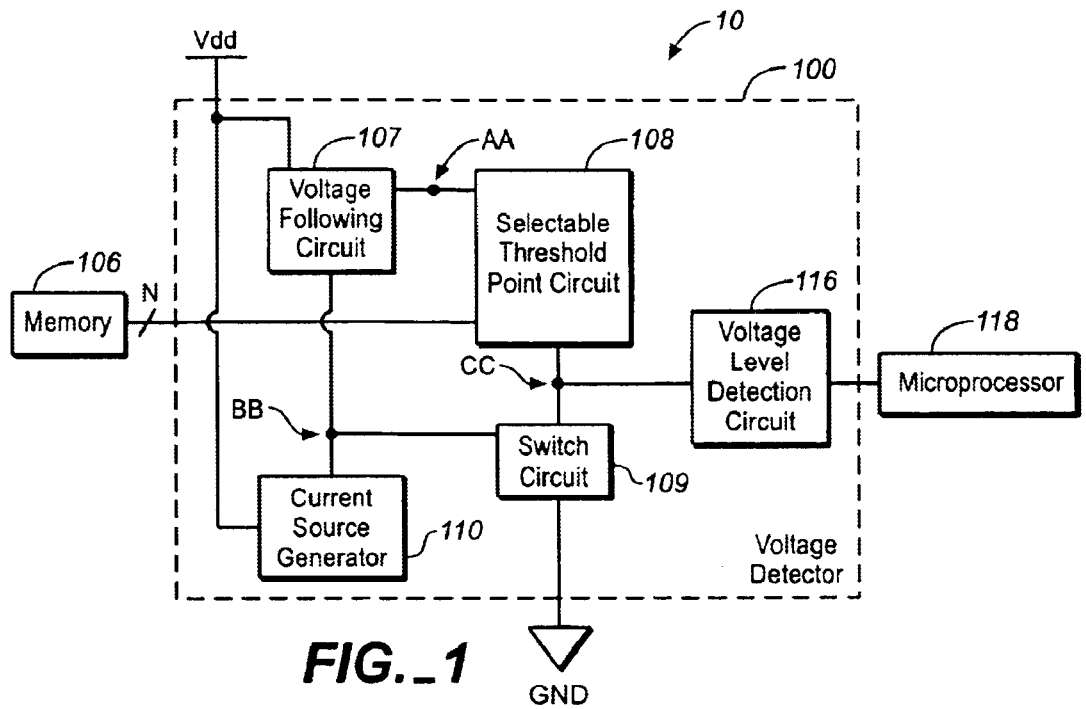
FIG._1
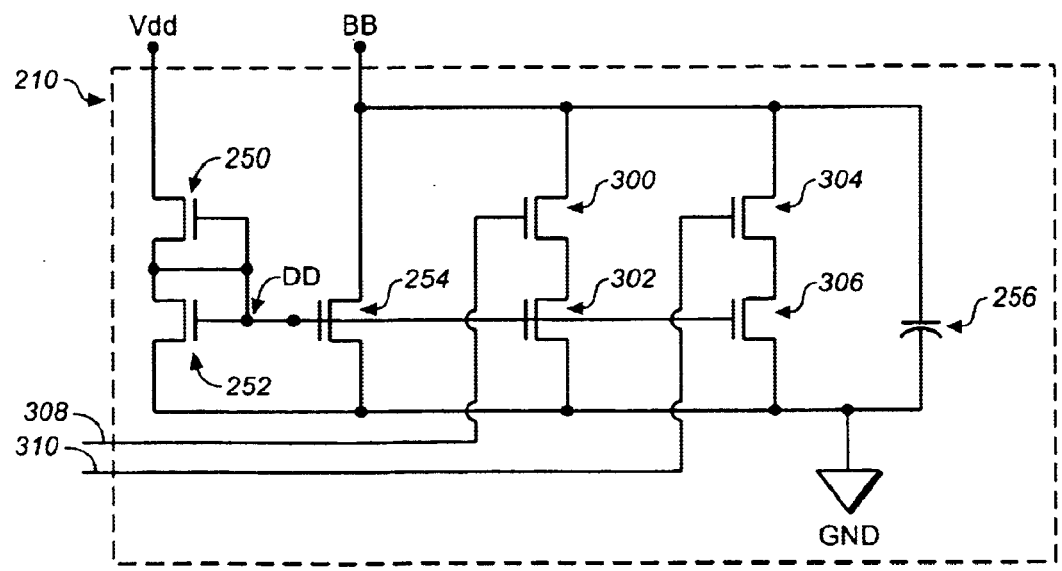
FIG._4

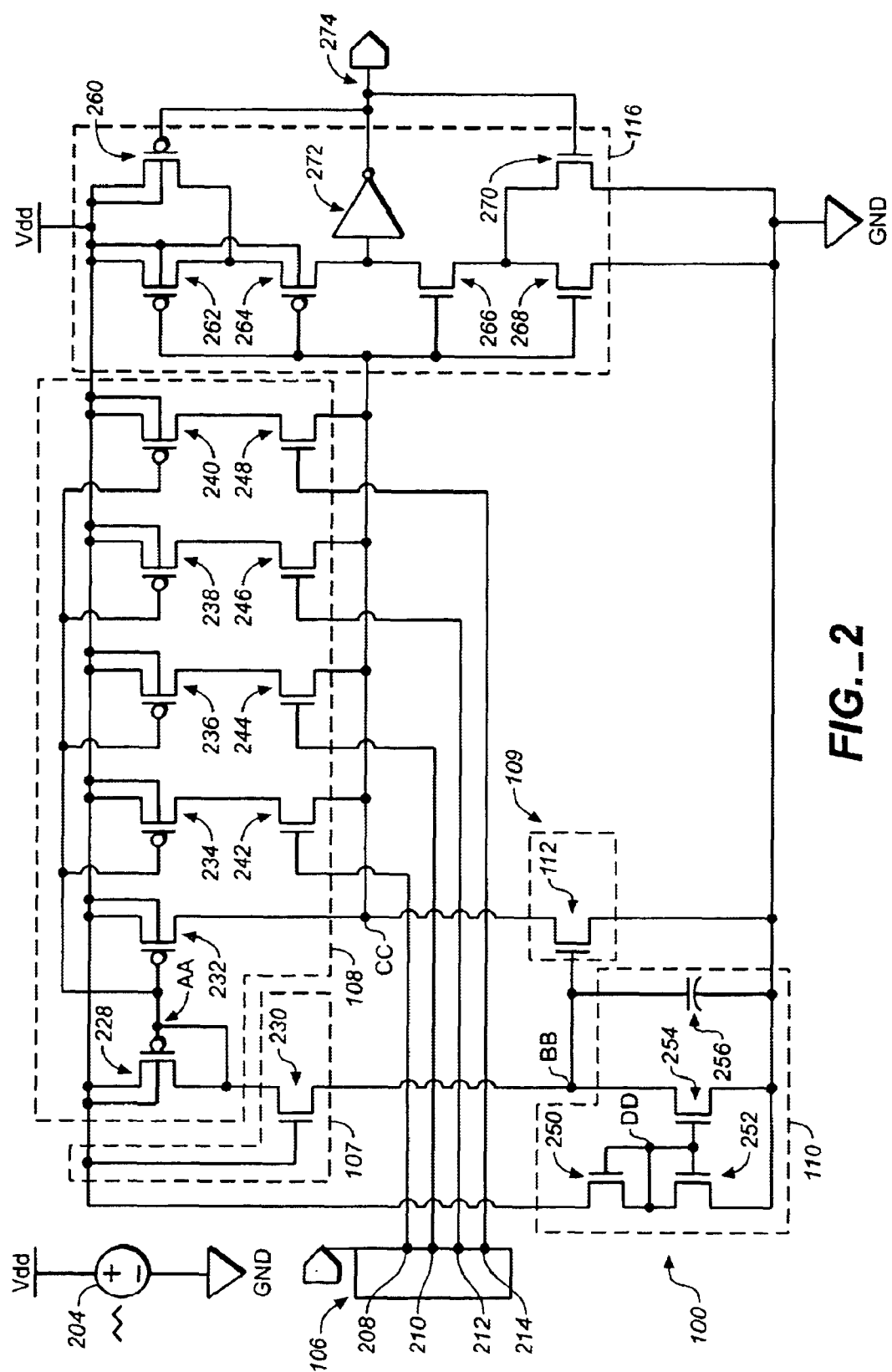
FIG._2

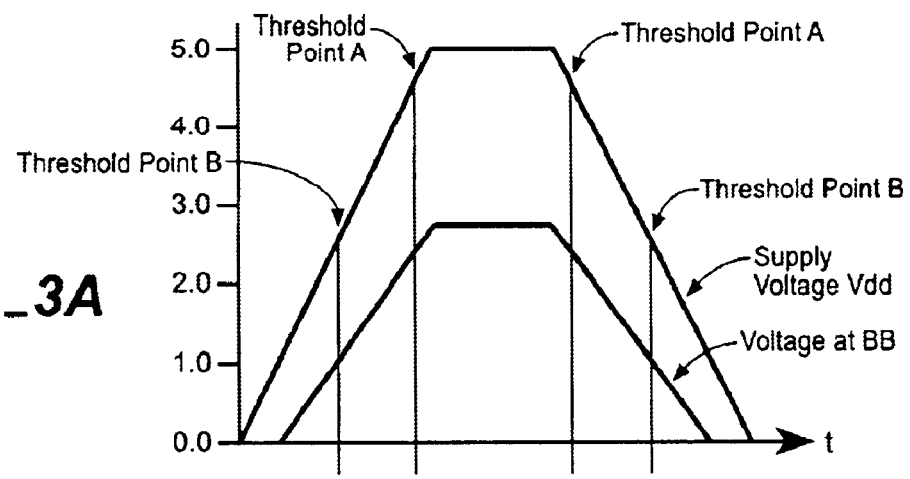
FIG._3A
FIG._3B
(THRESHOLD POINT B)
Transistor 112 Turns On — Transistor 112 Turns Off
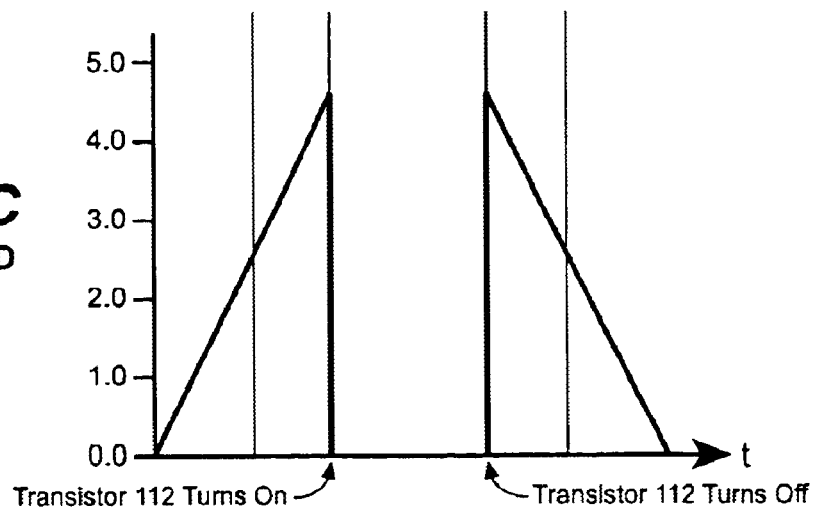
FIG._3C
(THRESHOLD POINT A)
Transistor 112 Turns On — Transistor 112 Turns Off

VOLTAGE DETECTOR CIRCUIT WITH A PROGRAMMABLE THRESHOLD POINT

CROSS-REFERENCE TO RELATED APPLICATION AND CLAIM OF PRIORITY

The present application is a continuation of U.S. patent application Ser. No. 09/780,208, filed on Feb. 9, 2001 now abandoned, entitled "Voltage Detector Circuit With A Programmable Threshold Point," which is assigned to the present assignee and hereby incorporated by reference in its entirety.

BACKGROUND

1. Field of the Invention

The present invention relates generally to voltage detectors and, more particularly, to a voltage detector circuit with a programmable threshold point.

2. Related Art

Battery-powered portable electronic devices, such as laptop computers and cell phones, require circuits to detect power-on and low power conditions of their battery power supplies. Without such circuits, the portable electronic devices may operate improperly or fail.

Circuits that detect power-on conditions are commercially available in the form of power supply monitoring chips. These chips typically have power supply voltage following circuits that track the power supply voltage and output a signal during turn-on when the power supply voltage surpasses a pre-determined threshold point on the rising-edge of the power supply voltage. The threshold point signifies a voltage sufficient for device operation and serves to provide safe startup of the devices by indicating when the power supplies have stabilized at acceptable voltage levels.

Circuits that detect low power conditions are also commercially available in the form of microprocessor reset chips. These chips track the power supply voltage and output a signal when the power supply voltage drops below a threshold point. In this case, the threshold point signifies that the power supply voltage has fallen to a level which is insufficient for device operation or that the power supply voltage is decreasing toward a critically low level.

One problem with previously developed technologies is that there are no chips having circuits that detect both the power-on and low power conditions. While it is possible to incorporate both a power monitoring circuit and a microprocessor reset circuit on a single chip, doing so would require a substantial amount of surface area for the chip. Additionally, connecting the two circuits unduly increases the complexity of the chip.

Another problem with previously developed technologies is that the individual power monitoring circuit chips and microprocessor reset circuit chips themselves are too large to fit inside small portable electronic devices, which are becoming smaller and smaller. One reason for this is that both types of chips require a circuit that generates a reference voltage from which a threshold point value is derived. This reference voltage generation circuit is relatively large and thus increases the size of the individual chips.

Another problem with previously developed technologies is that commercial reset chips only provide a small number of programmable threshold point values (e.g., 2 or 3). Chips offering a large number of threshold point values have preset levels for the threshold point values and are only available as discrete components.

It is also important that the amount of power or current consumed by circuits or chips in battery-powered portable electronic devices is low. This ensures that the battery-powered portable electronic devices can operate for commercially acceptable periods of time.

Accordingly, what is needed is a circuit that can be implemented on a single chip, that is capable of detecting both power-on and low power conditions, that can be programmed to detect a large number of threshold points values, and that consumes a low amount of current.

SUMMARY OF THE INVENTION

The present invention provides a detector that can be implemented on a single chip, that is capable of detecting both power-on and low power conditions, that can be programmed to detect a large number of threshold point values, and that consumes a low amount of current.

In one embodiment of the present invention, a voltage detector is disclosed. The voltage detector includes a voltage following circuit connected to a power supply and operable to follow a voltage value of the power supply, a selectable threshold point circuit connected to the voltage following circuit and operable to select one of a plurality of values for a threshold point of the power supply, and a switch circuit coupled to the selectable threshold point circuit and the voltage following circuit, the switch circuit cooperating with the selectable threshold point circuit to generate an output indicating whether the value of the power supply has increased above or decreased below the selected value for the threshold point in response to the followed value of the power supply.

In another embodiment of the present invention, a method for detecting a voltage level performed in a circuit is disclosed. The method includes selecting one of a plurality of values for a threshold point for a power supply, tracking a voltage value of the power supply, and generating an output that indicates whether the voltage value of the power supply has increased above or decreased below the selected value for the threshold point in response to the tracked value of the power supply.

In another embodiment of the present invention, a system including a memory, a microprocessor, and a voltage detector coupled to the memory and the microprocessor is disclosed. The voltage detector includes a voltage following circuit connected to a power supply and operable to follow a voltage value of the power supply, a selectable threshold point circuit connected to the voltage following circuit and operable to select one of a plurality of values for a threshold point of the power supply, and a switch circuit coupled to the selectable threshold point circuit and the voltage following circuit, the switch circuit cooperating with the selectable threshold point circuit to generate an output indicating whether the value of the power supply has increased above or decreased below the selected value for the threshold point in response to the followed value of the power supply.

Other aspects and advantages of the present invention will become apparent from the following descriptions and accompanying drawings.

BRIEF DESCRIPTION OF THE DRAWINGS

For a more complete understanding of the present invention and for further features and advantages, reference is now made to the following description taken in conjunction with the accompanying drawings, in which:

FIG. 1 is a block diagram of a system including a voltage detector, a memory, and a microprocessor, according to an embodiment of the present invention.

FIG. 2 is a schematic diagram of a circuit implementation for the voltage detector of FIG. 1, according to an embodiment of the present invention.

FIGS. 3A–3C are diagrams illustrating the response of the voltage detector of FIG. 2 to a varying supply voltage input.

FIG. 4 is a schematic diagram of a current source generator block, according to an embodiment of the present invention.

DETAILED DESCRIPTION OF THE INVENTION

The preferred embodiments of the present invention and their advantages are best understood by referring to FIGS. 1 through 4 of the drawings. Like numerals are used for like and corresponding parts of the various drawings.

FIG. 1 is a block diagram of a system 10 including a voltage detector 100, a memory 106, and a microprocessor 118, according to an embodiment of the present invention. Voltage detector 100 can be implemented on a single chip, is capable of detecting both power-on and low power conditions, can be programmed to detect a large number of threshold point values, and consumes a low amount of current.

Voltage detector 100 is connected to a power supply (or supply voltage) Vdd and a ground GND. Voltage detector 100 is also connected to memory 106, such as an electrically programmable read-only memory (EEPROM), and microprocessor 118. Memory 106 stores a plurality of bits which correspond to and define a number of values for a threshold voltage that can be programmed in detector 100. As used herein, the term "threshold voltage" refers to a value of supply voltage Vdd which is less than its maximum value and at which supply voltage Vdd may be considered to be at either a low power or power-off condition. For each threshold voltage value, a respective set of data bits may be provided in memory 106. The plurality of bits are conveyed from memory 106 to a selectable threshold point circuit block 108 within voltage detector 100 via a plurality of control signals N. In one embodiment, a separate control signal may be provided to selectable threshold point circuit 108 for each bit of a bit set. The number of bits (or control signals N) determines the resolution of the programmable threshold voltage. The use of more data bits in each bit set will allow more values to be defined, and thus provide greater resolution.

Selectable threshold point block 108 is connected to a switch circuit at a node CC, a voltage following circuit board 107 at node AA, and to a memory 106. Selectable threshold point circuit block 108 generally functions to select one of a number of values for the threshold voltage at which supply voltage Vdd is deemed to be at a low power or power-off condition. When the supply voltage Vdd has a value lower than the selected threshold voltage value, then selectable threshold point circuit block 108 may pull the voltage at node CC up to the level of Vdd.

Voltage following circuit block 107 is connected to supply voltage Vdd, selectable threshold point circuit block 108 at a node AA, and a current source generator at a node BB. Voltage following circuit block 107 follows or tracks supply voltage Vdd. Due to the operation of voltage following circuit board 107, the voltage at node BB follows supply voltage Vdd.

Current source generator block 110 is connected to node BB and supply voltage Vdd. Current source generator block 110 generally functions to generate a current which is provided to node BB.

A switch circuit block 109 is connected to voltage following circuit block 107 and current source generator block 110 at node BB, and to selectable threshold voltage circuit block 108 at a node CC. Switch circuit block 109 generally functions as a switch. When supply voltage Vdd has a value greater then the selected threshold voltage, switch circuit block 109 pulls the voltage of node CC to ground.

A voltage level detection circuit block 116 is connected to node CC and external microprocessor 118. Voltage level detection circuit block 116 generally functions to output a signal which indicates to microprocessor 118 whether the supply voltage Vdd is at a low power condition or a power-on condition. This is further described herein.

In operation, one of the bit sets stored in memory 106 is conveyed to selectable threshold point circuit block 108 via control signals N. The bit set essentially programs the selectable threshold point circuit 108, thus selecting the threshold voltage value associated with that data bit set. From another perspective, the control signals define the magnitude of a pull-up current that flows from node CC through selectable threshold point circuit block 108. Voltage following circuit block 107 tracks the power supply voltage Vdd and outputs a tracked voltage which appears at node BB, the input to switch circuit block 109. The tracked voltage controls the magnitude of a pull-down current that flows from node CC through switch circuit block 109. Node CC functions as a detection node for the threshold point.

When the magnitude of the voltage supply Vdd is lower than the selected threshold point, the pull-down current flowing through switch circuit block 109 is less than the pull-up current flowing through selectable threshold point circuit block 108. This pulls the voltage level of node CC to the voltage level of supply voltage Vdd through selectable threshold point circuitry block 108. The voltage level detection circuit block 116 detects this voltage value at node CC and, in response, outputs a signal which tracks the supply voltage Vdd. This signifies that the value of supply voltage Vdd is below the threshold point.

When the magnitude of the voltage supply Vdd is greater than the selected threshold point, the pull-down current flowing through switch circuit block 109 is greater than the pull-up current flowing through selectable threshold point circuit board 108. This pulls the voltage level of node CC to ground through switch circuit block 109. The voltage level detection circuit block 116 then detects this low voltage at node CC and, in response, outputs a driven and clearly defined low output to microprocessor 118. This signifies that the value of the voltage supply Vdd is above the threshold point.

FIG. 2 is a schematic diagram of a circuit implementation for voltage detector 100 of FIG. 1, according to an embodiment of the present invention. In particular, FIG. 2 depicts a number of circuits which correspond to voltage following circuit block 107, selectable threshold point circuit block 108, switch circuit block 109, current source generator block 110, and voltage level detection circuit block 116.

Voltage following circuit block 107 includes a weak NMOS transistor 230 configured as a source follower. Voltage following circuit block 107 functions to track supply voltage Vdd. The gate terminal of transistor 230 is connected to supply voltage Vdd. Supply voltage Vdd is provided by power source 204, which can be a battery. The source terminal of transistor 230 is connected to node BB. The drain terminal of transistor 230 is connected to selectable threshold voltage point block 108 at node AA.

Selectable threshold point circuit block 108 includes a number of PMOS current mirror transistors 232, 234, 236, 238, and 240, which function as current mirrors, coupled to a number of NMOS switch transistors 242, 244, 246, and 248, which function as switches. Selectable threshold point circuit block 108 functions to precisely set the value of the threshold voltage. A PMOS transistor 228 provides a reference for the current mirrors. The source and body terminals of current-reference transistor 228 are connected to supply voltage Vdd. The gate and drain terminals of current-reference transistor 228 are connected to current-mirror-reference node AA. The gate terminals of current mirror transistors 232, 234, 236, 238, and 240 are connected to current mirror reference node AA. The source and body terminals of current mirror transistors 232, 234, 236, 238, and 240 are connected to supply voltage Vdd. The drain terminal of current mirror transistor 232 is connected to node CC. The drain terminals of current mirror transistors 234, 236, 238, and 240 are connected to the drain terminals of switch transistors 242, 244, 246, and 248, respectively. The source terminals of switch transistors 242, 244, 246, and 248 are connected to node CC. The gate terminals of switch transistors 242, 244, 246, and 248 are connected to memory 106 to receive control signals 208, 210, 212 and 214, respectively, which are generated from bit sets in memory 106.

The selected value of the threshold voltage is determined by the amount of current which is allowed to flow from selectable threshold voltage circuit block 108 to node CC. If more current is allowed to flow, then the value selected for the threshold voltage will be higher. Conversely, if less current is allowed to flow, then the value selected for the threshold voltage will be lower.

In operation, when any of the control signals 208, 210, 212 and 214 have a logic high value, the respective switch transistor 242, 244, 246, and/or 248 is turned on. This allows current to flow through the respective current mirror transistor 234, 236, 238, and/or 240 to node CC. When any of control signals 208, 210, 212 and/or 214 have a logic low value, the respective switch transistor 242, 244, 246, and/or 248 is turned off. This prevents current from flowing through the respective current mirror transistor 234, 236, 238, and/or 240 to node CC. Note that the current always flows through current-mirror transistor 232 to node CC since it is not controlled by a switch transistor.

The amount of current conducted by each individual current mirror transistor 232, 234, 236, 238, and 240 is determined by its width to length (W/L) ratio. In one embodiment, current mirror transistors 232, 234, 236, 238, and 240 each have a different W/L ratio. Thus, the total amount of current that flows to node CC from selectable threshold point circuit block 108 can be precisely set and controlled depending on which switch transistors 242, 244, 246, and 248 have been turned on by respective control signals 208, 210, 212 and 214 (according to a particular data bit set).

In one embodiment, switch transistors 242, 244, 246, and 248 have W/L ratios of $5\mu/2\mu$. Current-mirror reference transistor 228 and current-mirror transistor 232 have W/L ratios of $8\mu/4\mu$, current-mirror transistor 234 has a W/L ratio of $3\mu/4\mu$, current-mirror transistor 236 has a W/L ratio of $6\mu/4\mu$, current-mirror transistor 238 has a W/L ratio of $8\mu/4\mu$, and current-mirror transistor 240 has a W/L ratio of $10\mu/4\mu$.

Switch circuit block 109 includes a weak NMOS transistor 112. Switch circuit block 109 allows node CC to be pulled up to the voltage level of supply voltage Vdd or down to ground GND depending on the amount of current being provided to node CC by selectable threshold point circuit block 108 and the value of the tracked supply voltage appearing at node BB. The gate terminal of transistor 112 is connected to node BB. The drain terminal of transistor 112 is connected to node CC. The source terminal of transistor 112 is connected to ground GND. When the value of supply voltage Vdd is above the selected value for the threshold voltage, transistor 112 is turned on, and the voltage at node CC is pulled low.

Current source generator block 110 includes an NMOS transistor 250 (which can be a depletion type transistor), NMOS transistors 252 and 254, and a capacitor 256. Transistor 252 is configured as a diode-connected current reference transistor and transistor 254 is configured as a current mirror. The drain terminal of transistor 250 is connected to supply voltage Vdd. The gate and source terminals transistor 250, the gate and drain terminals of transistor 252, and the gate terminal of transistor 254 are connected together at a node DD. The source terminals of transistors 252 and 254 as well as one terminal of capacitor 256 are connected to ground GND. The other terminal of capacitor 256 and the drain terminal of transistor 254 are connected to node BB. The gate-source connected transistor 250 sets the current level passed to current reference transistor 252. This current level is relatively constant and independent of voltage source 204.

In operation, transistor 250 provides current to current reference transistor 252. This current is proportionately mirrored in current mirror transistor 254. The mirrored current, acting against the pull-up current provided by PMOS transistor 228 (in the selectable threshold voltage circuit block 108) and weak NMOS transistor 230 (in the voltage-following circuitry block 107), sets the voltage at the node BB, that is, the gate voltage of weak transistor 112 (in switch block 109). The voltage at node BB increases with an increasing power supply voltage Vdd. Capacitor 256 stabilizes the voltage at node BB.

In one embodiment, NMOS transistors 252 and 254 both have W/L ratios of $4\mu/4\mu$ and capacitor 256 has a capacitance of 500fF.

Voltage level detection circuit block 116 includes PMOS transistors 260, 262, and 264, NMOS transistors 266, 268, and 270, and an inverter 272. The source and body terminals of transistors 260 and 262 are connected to supply voltage Vdd. The gate terminal of transistor 262 is connected to node CC. The drain terminal of transistor 262 is connected to the source terminal of transistor 264 and to the drain terminal of transistor 260. The body terminal of transistor 264 is connected to supply voltage Vdd. The gate terminal of transistor 264 is connected to node CC. The drain terminal of transistor 264 is connected to the drain terminal of transistor 266 and to the input terminal of inverter 272. The gate terminal of transistor 266 is connected to node CC. The source terminal of transistor 266 is connected to the drain terminals of transistors 268 and 270. The gate terminal of transistor 268 is connected to node CC. The source terminals of transistors 268 and 270 are connected to ground GND. The gate terminals of transistor 270 and transistor 260 are connected to the output terminal of inverter 272. The inverter 272 outputs an output signal 274. Transistors 262, 264, 266, and 268 are connected as an inverter. This inverter, in combination with inverter 272, forms a hysteresis circuit. Transistors 260 and 270 provide a feedback loop.

In one embodiment, transistor 268 has a W/L ratio of $10\mu/2\mu$, transistor 266 has a W/L ratio of $7\mu/1\mu$, and NMOS transistor 270 has a W/L ratio of $12\mu/1\mu$. Transistor 262 has a W/L ratio of 20μ/2μ, transistor 264 has a W/L ratio of 15μ/1μ, and transistor 260 has a W/L ratio of 24μ/1μ.

In operation, voltage level detection circuit block 116 monitors the voltage at node CC, which indicates when supply voltage Vdd is less than or greater than the programmed threshold voltage. The threshold point for supply voltage Vdd is reached when the pull-up current from the selectable threshold point circuit block 108 is equals the pull-down current in transistor 112. If the magnitude of the supply voltage Vdd is lower than the threshold point, the current flowing through selectable threshold point circuit block 108 pulls the voltage at node CC up to the level of Vdd. This indicates a low power condition. In contrast, if the magnitude of the supply voltage Vdd is greater than the threshold point, the current flowing through transistor 112 pulls the voltage at node CC to ground GND. This indicates a sufficient/adequate power condition. The voltage at node CC is put through the hysteresis circuit (consisting of two inverters) and a feedback loop to sharpen the output signal and to prevent it from responding to small signal perturbations on the node CC at the threshold point.

FIGS. 3A–3C are diagrams illustrating the response of the voltage detector of FIG. 2 to a varying supply voltage input. FIG. 3A shows the magnitude of the supply voltage Vdd and the magnitude of the voltage at node BB on the y-axis versus time on the x-axis. FIG. 3B shows the magnitude of the output signal 274 appearing at the output terminal of voltage detector 100 on the y-axis versus time on the x-axis when an exemplary threshold point B has been programmed. FIG. 3C shows the magnitude of the output signal 274 appearing at the output terminal of voltage detector 100 on the y-axis versus time on the x-axis when an exemplary threshold point A has been programmed. Although FIGS. 3B and 3C only shows the response for two programmed threshold points, threshold point A and threshold point B, skilled artisans will recognize that a large number of programmable threshold voltages can be precisely defined using selectable threshold point circuit block 108.

Initially, as the level of supply voltage Vdd increases from 0.0 volts, both the voltage at node BB and the voltage at the output terminal of voltage detector (output signal 274) increase proportionally. When Vdd exceeds the programmed threshold point (approximately 2.5 volts for threshold point B and 4.3 volts for threshold point A), the voltage at node BB increases proportionally, but the voltage at the output terminal of voltage detector 100 (output signal 274) falls to approximately 0.0 volts. This signifies a power-on condition.

As long as the magnitude of the supply voltage Vdd is above the threshold point, the voltage at the output terminal of voltage detector 100 remains at approximately 0.0 volts. But, as the magnitude of supply voltage Vdd decreases from 5.0 volts, the voltage at node BB decreases proportionally. When the magnitude of the supply voltage Vdd decreases below the programmed threshold point (approximately 2.5 volts for threshold point B and 4.3 volts for threshold point A), the voltage at the output terminal of voltage detector 100 rises from 0.0 volts to the programmed threshold point. This indicates a low voltage condition. Then as the magnitude of the supply voltage Vdd continues to decrease, both the voltage at node BB and the voltage at the output terminal of voltage detector 100 decrease proportionally.

FIG. 4 is a schematic diagram of a current source generator block 210, according to an embodiment of the present invention. Current source generator block 210 can be used as an alternative to current source generator block 110 of FIG. 2.

Current source generator block 210, like the current source generator block 110, includes NMOS transistor 250, NMOS transistors 252 and 254, node DD, and capacitor 256. Current source generator block 210 further includes NMOS transistors 300, 302, 304, and 306. NMOS transistors 300 and 302 are connected in series, as are NMOS transistors 304 and 306. The source terminals of NMOS transistors 302 and 306 are connected to ground GND. The gate terminals of NMOS transistors 302 and 306 are connected to node DD. The drain terminals of NMOS transistors 300 and 304 are connected to node BB. The gate terminals of NMOS transistors 300 and 304 are connected to receive control signals 308 and 310, respectively. Control signals 308 and 310 may be generated from data stored in memory 106.

Transistor 252 functions as a current reference and each of transistors 254, 302, and 306 function as current mirrors. Transistors 300 and 304 function as switches for current mirror transistors 302 and 306, respectively.

In operation, when any of control signals 308 or 310 have a logic high value, the respective switch transistor 300 and/or 304 is turned on. This allows current to flow through the respective current mirror transistor 302 and/or 306 to node BB. When any of control signals 308 or 310 have a logic low value, the respective switch transistor 300 and/or 304 is turned off. This prevents current from flowing through the respective current mirror 302 and/or 306 to node BB.

While particular embodiments of the present invention and their advantages have been shown and described, it should be understood that various changes, substitutions, and alterations can be made therein without departing from the spirit and scope of the invention as defined by the appended claims.

What is claimed is:

1. A voltage detector comprising:
   a voltage following circuit connected to a power supply and operable to follow a voltage value of the power supply;
   a selectable threshold point circuit connected to the voltage following circuit and operable to provide one of a plurality of values for a threshold point of the power supply without using a reference voltage; and
   a switch circuit coupled to the selectable threshold point circuit and the voltage following circuit, the switch circuit cooperating with the selectable threshold point circuit to generate an output indicating whether the value of the power supply has increased above or decreased below the provided value for the threshold point in response to the followed value of the power supply.

2. The voltage detector of claim 1 wherein the selectable threshold point circuit is operable to receive a plurality of control signals.

3. The voltage detector of claim 1 wherein the selectable threshold point circuit is operable to output a programmable amount of current.

4. The voltage detector of claim 1 wherein the selectable threshold point circuit comprises a plurality of current mirror transistors.

5. The voltage detector of claim 4 wherein at least one of the current mirror transistors is coupled to a respective switch transistor.

6. The voltage detector of claim 5 wherein the switch transistor is operable to receive a control signal.

7. The voltage detector of claim 1 wherein the selectable threshold point circuit comprises a plurality of current mirror transistors, at least two of the current mirror transistors having a different width-to-length ratio.

8. The voltage detector of claim 1 wherein the switch circuit comprises a transistor.

9. The voltage detector of claim 8 wherein a gate of the transistor receives the followed value of the power supply.

10. The voltage detector of claim 1 wherein the switch circuit and the selectable threshold point circuit are connected at a detection node, the switch circuit operable to pull a voltage at the detection node to ground when the value of the power supply is above the provided value for the threshold point.

11. The voltage detector of claim 1 wherein the switch circuit and the selectable threshold point circuit are connected at a detection node, the selectable threshold point circuit operable to pull a voltage at the detection node up to the value of the power supply when the power supply is below the provided value for the threshold point.

12. The voltage detector of claim 1 further comprising a current source generator block coupled to the voltage-following circuit and the switch circuit.

13. The voltage detector of claim 12 wherein the current source generator block comprises:
a reference transistor; and
a current mirror transistor coupled to the reference transistor and the switch circuit.

14. The voltage detector of claim 12 wherein the current source generator block comprises:
a reference transistor; and
a plurality of current mirror transistors coupled to the reference transistor and the switch circuit.

15. The voltage detector of claim 1 further comprising a voltage level detection circuit coupled to the selectable threshold point circuit and the switch circuit, the voltage level detection circuit operable to output a signal indicating whether the value of the power supply is above or below the provided value for the threshold point.

16. A method for detecting a voltage level performed in a circuit, the method comprising:
providing one of a plurality of values for a threshold point for a power supply without using a reference voltage;
tracking a voltage value of the power supply; and
generating an output that indicates whether the voltage value of the power supply has increased above or decreased below the provided value for the threshold point in response to the tracked value of the power supply.

17. The method of claim 16 wherein providing comprises transmitting at least one control signal to the circuit.

18. The method of claim 16 wherein providing comprises turning on at least one switch transistor.

19. The method of claim 16 wherein generating comprises pulling a voltage level at a detecting node to ground when the value of the power supply exceeds the provided threshold point.

20. The method of claim 16 wherein generating comprises pulling a voltage level at a detecting node to the value of the power supply when the value of the power supply is below the provided threshold point.

21. A system comprising:
a memory;
a microprocessor; and
a voltage detector coupled to the memory and the microprocessor, the voltage detector comprising:
a voltage following circuit connected to a power supply and operable to follow a voltage value of the power supply;
a selectable threshold point circuit connected to the voltage following circuit and operable to provide one of a plurality of values for a threshold point of the power supply without using a reference voltage; and
a switch circuit coupled to the selectable threshold point circuit and the voltage following circuit, the switch circuit cooperating with the selectable threshold point circuit to generate an output indicating whether the value of the power supply has increased above or decreased below the provided value for the threshold point in response to the followed value of the power supply.

22. The system of claim 21 wherein the selectable threshold point circuit is operable to receive a plurality of control signals.

23. The system of claim 21 wherein the selectable threshold point circuit is operable to output a programmable amount of current.

24. The system of claim 21 wherein the selectable threshold point circuit comprises a plurality of current mirror transistors.

25. The system of claim 24 wherein at least one of the current mirror transistors is coupled to a respective switch transistor.

26. The system of claim 25 wherein the switch transistor is operable to receive a control signal.

27. The system of claim 21 wherein the selectable threshold point circuit comprises a plurality of current mirror transistors, at least two of the current mirror transistors having a different width-to-length ratio.

28. The system of claim 21 wherein the switch circuit comprises a transistor.

29. The system of claim 28 wherein a gate of the transistor receives the followed value of the power supply.

30. The system of claim 21 wherein the switch circuit and the selectable threshold point circuit are controlled at a detection node, the switch circuit operable to pull a voltage at the detection node to ground when the value of the power supply is above the provided value for the threshold point.

31. The system of claim 21 wherein the switch circuit and the selectable threshold point circuit are connected at a detection node, the selectable threshold point circuit operable to pull a voltage at the detection node up to the value of the power supply when the power supply is below the provided value for the threshold point.

32. The system of claim 21 further comprising a current source generator block coupled to the voltage-following circuit and the switch circuit.

33. The system of claim 32 wherein the current source generator block comprises:
a reference transistor; and
a current mirror transistor coupled to the reference transistor and the switch circuit.

34. The system of claim 32 wherein the current source generator block comprises:
a reference transistor; and
a plurality of current mirror transistors coupled to the reference transistor and the switch circuit.

35. The system of claim 21 further comprising a voltage level detection circuit coupled to the selectable threshold point circuit and the switch circuit, the voltage level detection circuit operable to output a signal indicating whether the value of the power supply is above or below the provided value for the threshold point.

* * * * *